United States Patent
Cheng et al.

(10) Patent No.: US 10,236,381 B2
(45) Date of Patent: Mar. 19, 2019

(54) IFINFET

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Geng Wang, Stormville, NY (US); Qintao Zhang, Mt. Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/607,796

(22) Filed: May 30, 2017

(65) Prior Publication Data

US 2018/0090605 A1   Mar. 29, 2018

Related U.S. Application Data

(62) Division of application No. 15/278,400, filed on Sep. 28, 2016, now Pat. No. 9,728,621.

(51) Int. Cl.
*H01L 29/78* (2006.01)
*H01L 29/49* (2006.01)
(Continued)

(52) U.S. Cl.
CPC ........ *H01L 29/785* (2013.01); *H01L 29/0653* (2013.01); *H01L 29/1037* (2013.01); *H01L 29/42392* (2013.01); *H01L 29/4983* (2013.01); *H01L 29/66439* (2013.01); *H01L 29/66545* (2013.01); *H01L 29/66742* (2013.01); *H01L 29/78618* (2013.01); *H01L 29/78651* (2013.01);
(Continued)

(58) Field of Classification Search
CPC ............... H01L 29/785; H01L 29/0653; H01L 29/1037
USPC ....................................................... 257/347
See application file for complete search history.

(56) References Cited

U.S. PATENT DOCUMENTS

| 7,709,277 B2 * | 5/2010 | Lee ..................... C09K 13/08 257/E21.228 |
| 9,728,621 B1 | 8/2017 | Cheng et al. |

(Continued)

OTHER PUBLICATIONS

List of IBM Patents or Patent Applications Treated as Related; (Appendix P), Filed Jan. 5, 2018; p. 1-2.

*Primary Examiner* — Ori Nadav
(74) *Attorney, Agent, or Firm* — Cantor Colburn LLP; Vazken Alexanian

(57) ABSTRACT

A method of manufacturing an integrated circuit is provided. According to the method, a layered fin including a plurality of sacrificial layers and semiconductor layers wherein two adjacent semiconductor layers are separated by the sacrificial layer is provided on a semiconductor substrate. A gate over the layered fin and a spacer surrounding a sidewall of the gate are then formed. The sacrificial layers are subsequently removed to provide a structure in which two adjacent semiconductor layers are separated by a gap. The method further includes forming an insulator in the gap and forming source and drain regions located on the layered fin. The insulator includes a high-K dielectric material surrounded by a low-K dielectric material, both of which are in contact with the two adjacent semiconductor layers.

12 Claims, 16 Drawing Sheets

(51) Int. Cl.
*H01L 29/786* (2006.01)
*H01L 29/423* (2006.01)
*H01L 29/66* (2006.01)
*H01L 29/06* (2006.01)
*H01L 29/10* (2006.01)

(52) U.S. Cl.
CPC .... *H01L 29/78696* (2013.01); *H01L 29/0673* (2013.01)

(56) References Cited

U.S. PATENT DOCUMENTS

| | | | | |
|---|---|---|---|---|
| 2012/0138886 A1* | 6/2012 | Kuhn | ................ | B82Y 10/00 257/9 |
| 2015/0008501 A1* | 1/2015 | Sakuma | ............ | H01L 21/28273 257/316 |

* cited by examiner

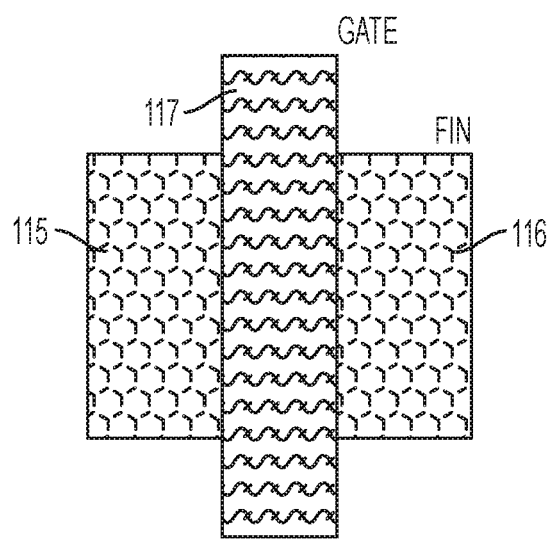
FIG. 12B
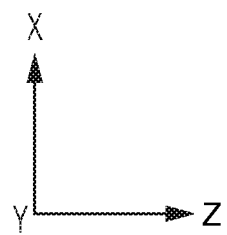

IFINFET

DOMESTIC PRIORITY

This application is a divisional of U.S. Non-Provisional application Ser. No. 15/278,400, entitled "IFINFET", filed Sep. 28, 2016, which is incorporated herein by reference in its entirety.

BACKGROUND

The present invention generally relates to semiconductor devices, and more specifically relates to fabrication methods and resulting structures for inserted oxide FinFET devices.

The FinFET multi-gate transistor structure is widely used in 14/16 nm generation complementary metal-oxide-semiconductor (CMOS) technologies. To enable ultimate gate-length scaling, gate-all-around (GAA) field effect transistors (FET) have been developed. Although the GAA FET structure can provide superior electrostatics, it comes with process challenges such as forming spacers and filling gate metal between nanowires. Inserted-oxide fin field effect transistors (iFinFET) have been proposed to achieve a trade-off between process challenges and electrostatics.

SUMMARY

Embodiments provide a method of manufacturing an integrated circuit. In this method, a semiconductor substrate is first provided. The layered fin including a plurality of sacrificial layers and a plurality of semiconductor layers, wherein two adjacent semiconductor layers are separated by the sacrificial layer, is formed on the semiconductor substrate. The method further includes forming a gate over the layered fin and a spacer surrounding a sidewall of the gate. The sacrificial layers are subsequently removed to provide a structure in which two adjacent semiconductor layers are separated by a gap. The method further includes forming an insulator in the gap, and forming source and drain regions located on the layered fin. The insulator includes a high-K dielectric material surrounded by a low-K dielectric material, which are in contact with the two adjacent semiconductor layers.

Other embodiments provide a semiconductor structure including a layered fin overlying the semiconductor substrate, wherein the layered fin includes a plurality of semiconductor layers and a plurality of insulator layers, wherein two adjacent semiconductor layers are separated by the insulator layer, a gate disposed over the layered fin, and source and drain regions located on the layered fin. The insulator layer includes a high-K dielectric material surrounded by a low-K dielectric material, wherein the high-K dielectric material and a low-K dielectric material are in contact with the two adjacent semiconductor layers.

Yet other embodiments provide a semiconductor structure including a layered fin overlying the semiconductor substrate. The layered fin includes a plurality of semiconductor layers and a plurality of insulator layers. Two adjacent semiconductor layers are separated by the insulator layer, a dielectric spacer disposed over the layered fin, and a metal gate disposed over the dielectric spacer. The insulator layer includes a high-K dielectric material, which is in contact with the two adjacent semiconductor layers.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 12B is a top view showing the fin channel of the final device structure underneath the gate, in accordance with the embodiments of the present invention.

Reference is made below to the above-described drawings, which are not drawn to scale for ease of understanding, wherein the same reference numbers used throughout different figures designate the same or similar components.

DETAILED DESCRIPTION

Figure 1:
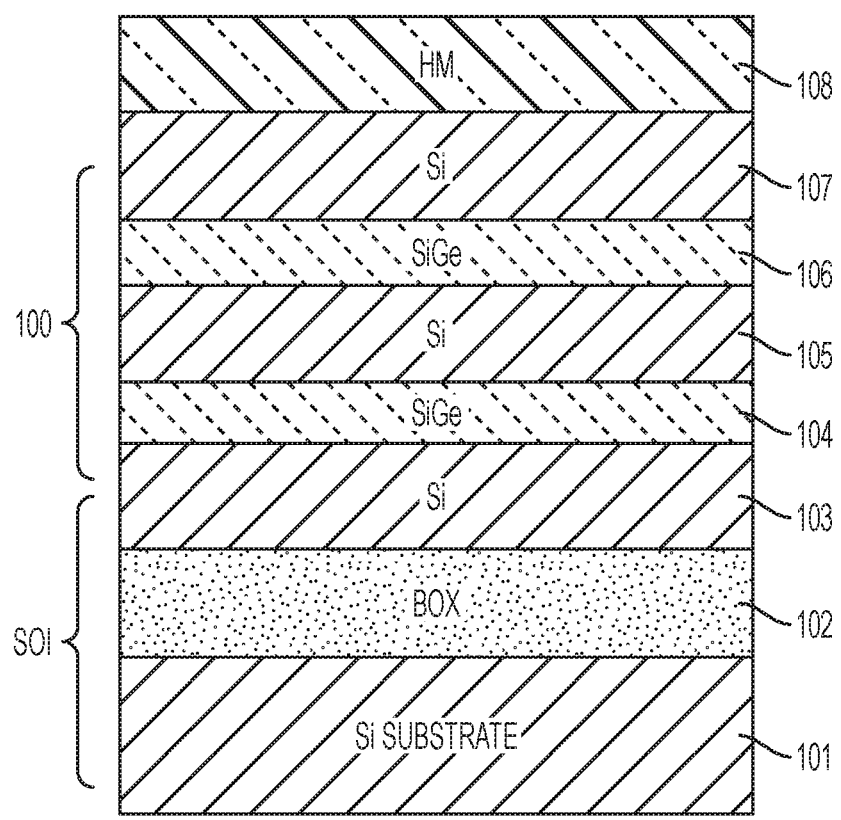
FIG. 1 is a cross-sectional view showing a layered stack including alternating Si and SiGe layers, in accordance with the embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

For the sake of brevity, conventional techniques related to semiconductor devices and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD), among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying invention will be apparent to those skilled in the art from this invention.

As stated above, the FinFET multi-gate transistor structure is widely used in 14/16 nm generation complementary metal-oxide-semiconductor technologies. It is anticipated that gate-all-around (GAA) field-effect transistors (FETs) will be adopted in future generations to enable ultimate gate-length scaling. It has been noted that to achieve similar (or even better) layout area efficiency as a FinFET, a GAA FET must include stacked nanowires (NWs) with significant added fabrication process complexity. In addition, it will be more difficult to implement multiple gate-oxide thicknesses as needed for system-on-chip (SoC) applications, in GAA FET technology. Recently, an evolutionary multi-gate transistor design, the inserted-oxide FinFET (iFinFET), was introduced to mitigate these issues. In high-performance applications, the iFinFETs were shown to be superior to the FinFET. However, there still remains a need for an iFinFET having improved drive current, reduced parasitic capacitance, and improved short channel control.

Embodiments of the present invention provide a semiconductor structure including a layered fin overlying the semiconductor substrate, wherein the layered fin includes a plurality of semiconductor layers and a plurality of insulator layers, wherein two adjacent semiconductor layers are separated by the insulator layer, a gate disposed over the layered fin, and source and drain regions located on the layered fin. The insulator layer includes a high-K dielectric material surrounded by a low-K dielectric material, wherein the high-K dielectric material and a low-K dielectric material are in contact with the two adjacent semiconductor layers. K stands for the relative dielectric constant. For example, the relative dielectric constant (K) of vacuum is 1.

Embodiments of the present invention further provide a semiconductor structure including a layered fin overlying the semiconductor substrate. The layered fin includes a plurality of semiconductor layers and a plurality of insulator layers. Two adjacent semiconductor layers are separated by the insulator layer, a dielectric spacer disposed over the layered fin, and a metal gate disposed over the dielectric spacer. The insulator layer includes a high-K dielectric material, which is in contact with the two adjacent semiconductor layers.

Embodiments of the present invention also provide a method of manufacturing an integrated circuit. In this method, a semiconductor substrate is first provided. The layered fin including a plurality of sacrificial layers and a plurality of semiconductor layers, wherein two adjacent semiconductor layers are separated by the sacrificial layer, is formed on the semiconductor substrate. The method further includes forming a gate over the layered fin and a spacer surrounding a sidewall of the gate. The sacrificial layers are subsequently removed to provide a structure in which two adjacent semiconductor layers are separated by a gap. The method further includes forming an insulator in the gap, and forming source and drain regions located on the layered fin. The insulator includes a high-K dielectric material surrounded by a low-K dielectric material, which are in contact with the two adjacent semiconductor layers.

Turning now to a more detailed description of embodiments of the present invention, FIG. 1 illustrates a structure including alternating layers of silicon (Si) and silicon germanium (SiGe) overlying a buried oxide layer (BOX) 102 disposed on a semiconductor substrate 101. As used herein, the term "substrate" 101 encompasses semiconductor materials conventionally used in the semiconductor industry from which to make electrical devices. Use of the buried oxide layer 102 on the substrate 101 is optional. In an embodiment, the starting substrate can be a semiconductor-on-insulator (SOI) substrate, which already includes the buried oxide layer. Alternatively, the starting substrate can be a bulk semiconductor including a sole semiconductor material or a combination of two or more semiconductor materials. The semiconductor material can include one or more monocrystalline silicon materials, such as the relatively pure or lightly impurity-doped monocrystalline silicon materials typically used in the semiconductor industry, as well as polycrystalline silicon materials, wherein silicon can be admixed with other elements such as germanium, carbon, and the like. The semiconductor material also includes other materials such as relatively pure and impurity-doped germanium, gallium arsenide, zinc oxide, glass, and the like. In an exemplary embodiment, the substrate 101 can be a monocrystalline silicon material. The silicon substrate 101 can be a bulk silicon wafer or can be a thin layer of silicon disposed over an insulating layer (SOI) that, in turn, can be supported by a carrier wafer. The buried oxide layer 102 can be disposed over the substrate 101. The buried oxide layer can be manufactured from materials including, for example, silicon oxide.

The substrate 101 can be silicon, germanium, silicon germanium, silicon carbide, and those consisting essentially of III-V compound semiconductors having a composition that can be defined by the formula $Al_{X1}Ga_{X2}In_{X3}As_{Y1}P_{Y2}N_{Y3}Sb_{Y4}$, wherein X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, wherein A1, A2, B1, and B2 are relative proportions each greater than or equal to zero and $A1+A2+B1+B2=1$ (1 being a total mole quantity). The semiconductor substrate can also include an organic semiconductor or a layered semiconductor such as, for example, Si/SiGe, a silicon-on-insulator or a SiGe-on-insulator. A portion or the entire semiconductor substrate can be amorphous, polycrystalline, or monocrystalline. In addition to the aforementioned types of semiconductor substrates, the semiconductor substrate employed in the present invention can also include a hybrid oriented (HOT) semiconductor substrate in which the HOT substrate has surface regions of different crystallographic orientation. The semiconductor substrate can be doped, undoped or can contain doped regions and undoped regions therein. The semiconductor substrate can contain regions with strain and regions without strain therein, or contain regions of tensile strain and compressive strain.

In an exemplary embodiment, a semiconductor layer can be a silicon (Si) layer and the sacrificial layer can be silicon germanium (SiGe) layer. Thus, a first Si layer 103 can be disposed over the buried oxide layer 102. The Si layer 103 can be obtained by any suitable techniques. In some embodiments, the Si layer is formed on the buried oxide layer by wafer bonding. The Si layer 103 can be doped or undoped. When doped, the Si layer can include "P" type dopants such as boron, aluminum, gallium, and indium, or n-type dopants such as phosphorus, arsenic, antimony. Other materials or combinations of materials can also be used. A thickness of the substrate 101 can vary from 0.01 millimeters to 1.5 millimeters, for example, from 0.5 millimeters to 0.75 millimeters. A thickness of the buried oxide layer can vary from 5 nanometers to 300 nanometers, for example, from 20 nanometers to 100 nanometers. A thickness of the Si layer 103 can vary from 5 nanometers to 100 nanometers, for example, from 10 nanometers to 30 nanometers, although greater or less thickness can also be used.

A first SiGe layer 104 can then be disposed over the Si layer 103. In an exemplary embodiment, the SiGe layer 104 can be formed from a mixture of silicon and germanium that can be deposited by epitaxial growth with a mixture of silane and germane such that the SiGe layer 104 has a monocrystalline structure. The SiGe layer 104 can directly contact the first Si layer 103 and the second Si layer 105. In an exemplary embodiment, the SiGe layer 104 can be about 10 to about 90 mole % germanium, and about 10 to about 90 mole % silicon. In alternate embodiments, the SiGe layer 104 can be about 10 to about 50 mole % germanium, and about 50 to about 90 mole % silicon, or about 15 to about 30 mole % germanium and about 70 to about 85 mole % silicon. A thickness of the germanium layer can vary from 5 nanometers to 100 nanometers, for example, from 10 nanometers to 30 nanometers, although greater or less thickness can also be used. In some embodiments, a plurality of alternating Si and SiGe layers can be formed overlying the buried oxide layer 102 disposed on the substrate 101. For example, the second Si layer 105 can be disposed over the first SiGe layer 104, a second SiGe layer 106 can be disposed over the second Si layer 105, and a third Si layer 107 can be disposed over the second SiGe layer 106. The alternating Si and SiGe layers overlying the substrate 101 and the buried oxide layer 102 produce a layered stack 100. The alternating SiGe and Si layers can be formed, for example, by alternating SiGe and Si epitaxy growth.

In an exemplary embodiment, a stack hard mask (HM) 108 can be formed overlying the layered stack 100 can be formed overlying the stack hard mask 108. The stack hard mask 108 can, for example, include silicon nitride, which can be deposited by chemical vapor deposition (CVD) or any other suitable deposition techniques, but other materials available in the art can be used in alternative embodiments.

Figure 2A:
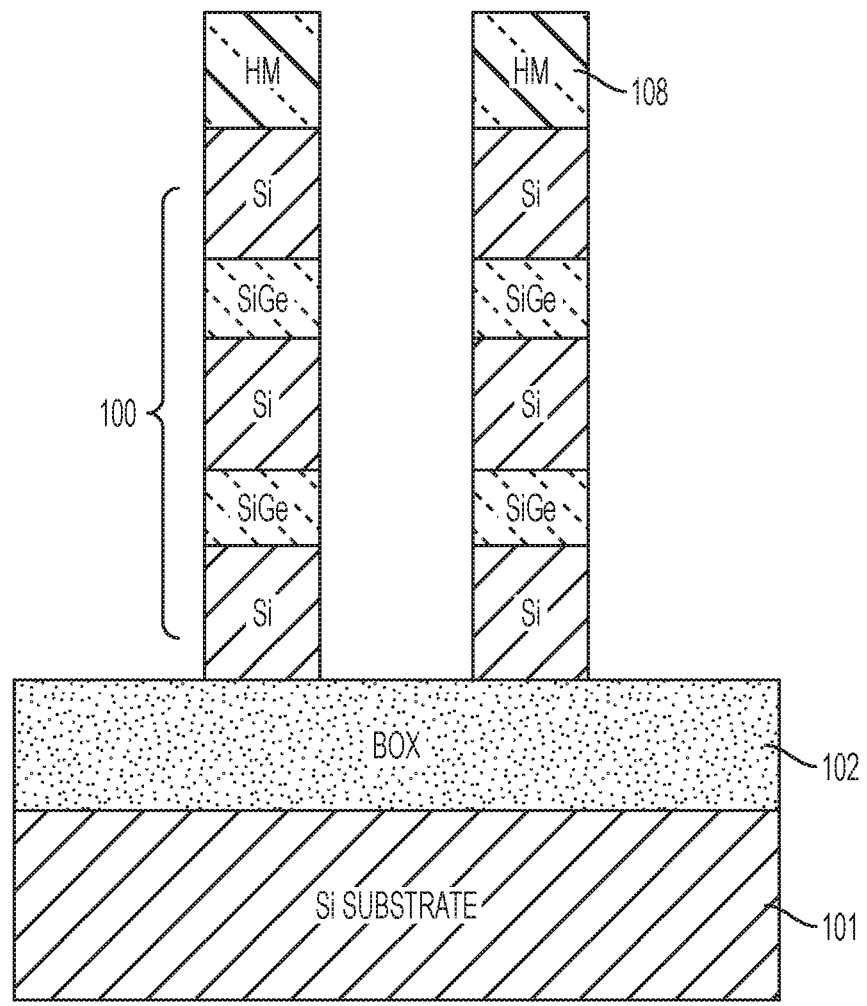
FIG. 2A is a cross-sectional view showing layered fins, in accordance with the embodiments of the present invention.
Figure 2B:
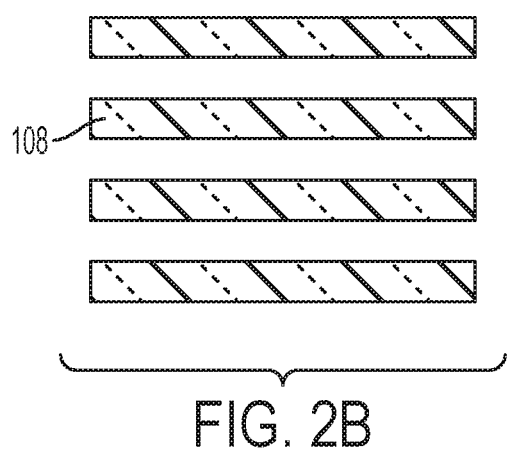
FIG. 2B is a top view showing layered fins, in accordance with the embodiments of the present invention.

The layered stack and the underlying SiGe/Si stack can be patterned so that SiGe/Si stack is removed except for where it can be protected by the remaining stack hard mask 108 to form a plurality of layered fins, as shown in FIG. 2A. Any suitable patterning techniques can be used. In some embodiments, the patterning is done by sidewall image transfer (SIT) technique. In other embodiments, the patterning is done by lithography followed by direction etch such as reactive ion etch (RIE). The layered fin includes the Si layers and the SiGe layers alternating along a height of the layered fin, and a fin base including the substrate 101 and the buried oxide layer 102 disposed under the alternating Si layers and SiGe layers. FIG. 2B is a top view showing the plurality of the layered fins covered by the hard mask 108.

The hard mask 108 can then be removed and a gate can be subsequently deposited over the layered fins. The starting gate can be a dummy gate or a real gate. A dummy gate is a sacrificial gate serving as a placeholder to facilitate the device fabrication. At certain point of the device fabrication, the dummy gate can be removed and replaced with a real gate. A real gate is a gate that remains in the final device structure. The real gate can include a gate dielectric and a gate conductor. As explained below, it can further include an insulator cap disposed on the top of the gate conductor.

The gate dielectric can include, but is not limited to, silicon oxide, silicon nitride, silicon oxynitride, boron nitride, high-K materials, or any combination thereof. Examples of high-K materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-K material can further include a dopant such as lanthanum or aluminum.

The gate conductor can include, but is not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, and gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, and nickel silicide), carbon nanotubes, conductive carbon, graphene, or any suitable combination of these materials. The conductive material can further include dopants that are incorporated during or after deposition.

The gate structure can further include a gate work function setting layer disposed between the gate dielectric and the gate conductor. The gate work function setting layer can be a metallic compound including, but not limited to, nitrides (e.g., titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), and niobium nitride (NbN)); carbides (e.g., titanium carbide (TiC), titanium aluminum carbide (TiAlC), tantalum carbide (TaC), and hafnium carbide (HfC)); and any combinations thereof.

Processes for forming gate dielectric and gate conductors include, but are not limited to, atomic layer deposition (ALD), molecular layer deposition (MLD), chemical vapor deposition (CVD), physical vapor deposition, sputtering, plating, evaporation, ion beam deposition, electron beam deposition, laser assisted deposition, chemical solution deposition, or any combination of those methods.

A gate cap, if present, can include, but is not limited to, silicon nitride, SiBCN, SiOCN, SiOC, silicon oxynitride, or any combination of any suitable dielectric materials.

Figure 3A:
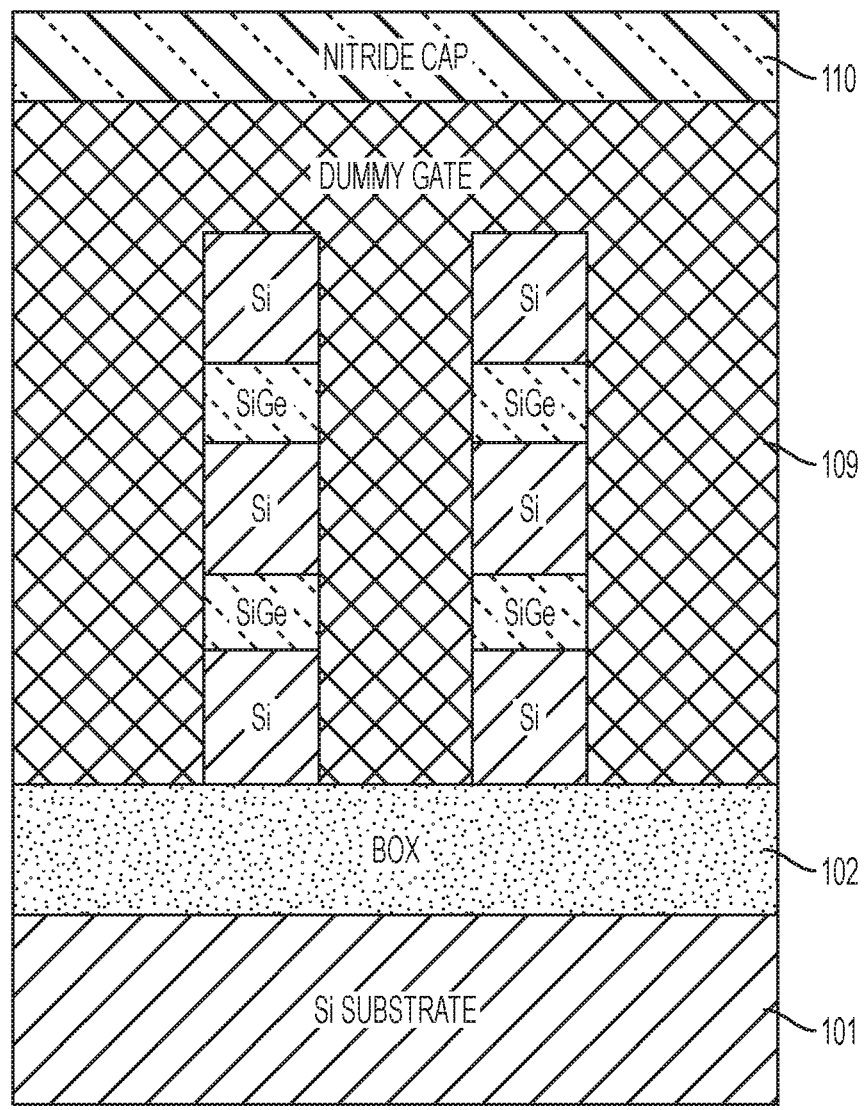
FIG. 3A is a cross-sectional view showing a dummy gate hard mask and a dummy gate overlying the layered fins, in accordance with the embodiments of the present invention.
Figure 3B:
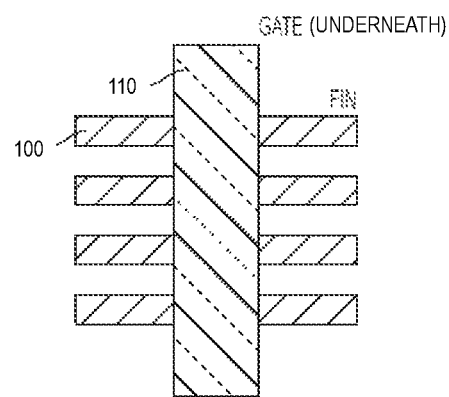
FIG. 3B is a top view showing a dummy gate hard mask and a dummy gate overlying the layered fins, in accordance with the embodiments of the present invention.

FIG. 3A shows a dummy gate 109 overlying the layered fins and adjacent to the sidewalls of the layered fins. The materials for the dummy gate 109 can include any of the materials listed above. In an exemplary embodiment, the dummy gate 109 can be formed by depositing a dummy gate dielectric (e.g., silicon oxide) followed by depositing amorphous silicon or polycrystalline silicon (polysilicon) overlying the layered fins and the buried oxide layer 102. A dummy gate hard mask 110 can be formed overlying the polysilicon, and patterned by any suitable patterning technique to leave the dummy gate hard mask 110 overlying the portion of the polysilicon to form the dummy gate 109. The dummy gate hard mask can, for example, include silicon nitride, silicon oxide, silicon oxynitride, or any suitable combination of those materials, but other materials available in the art can be used in alternative embodiments. FIG. 3B is a top view showing the dummy gate hard mask 110 disposed over the layered fins.

Figure 4A:
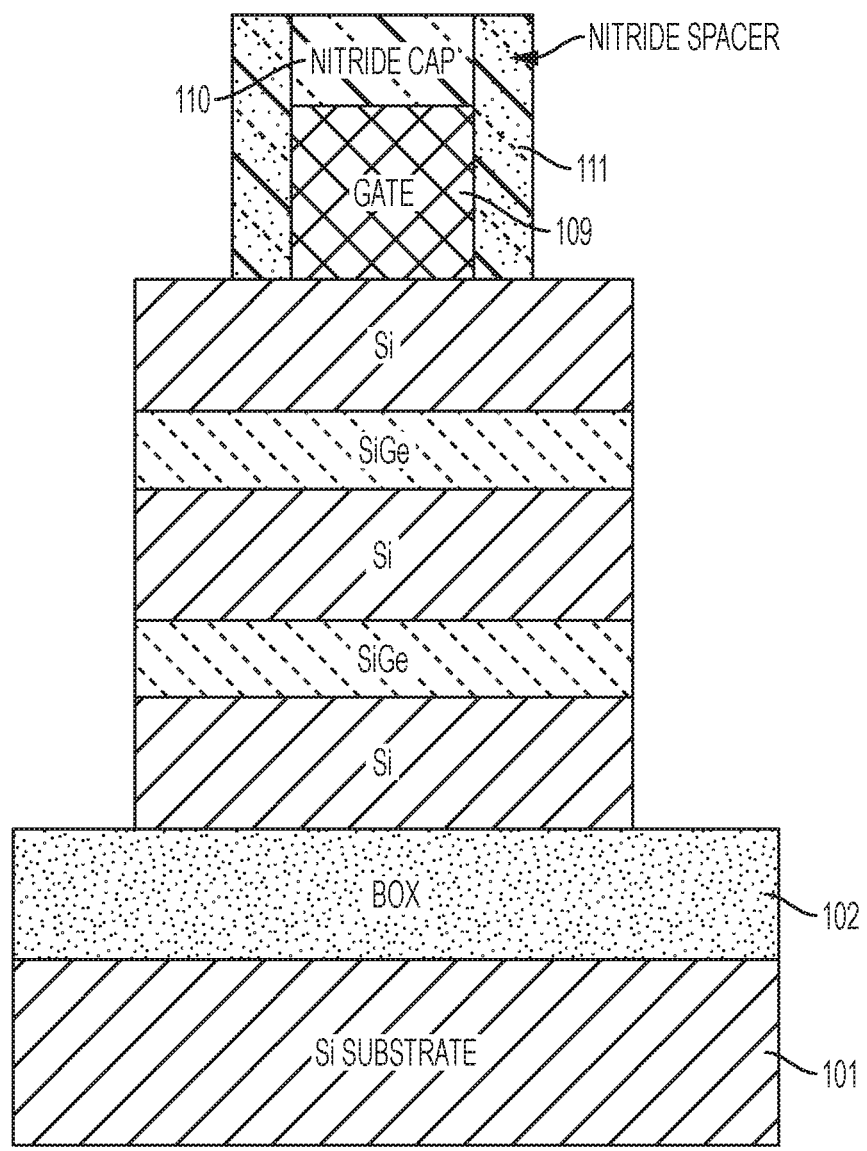
FIG. 4A is a cross-sectional view showing a gate and a cap overlying the layered fins, in accordance with the embodiments of the present invention.
Figure 4B:
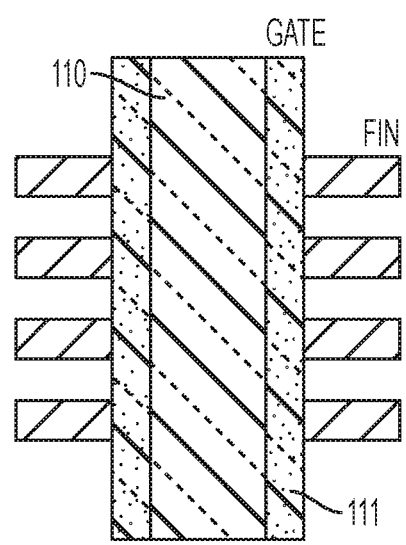
FIG. 4B is a top view showing a gate and a cap overlying the layered fins, in accordance with the embodiments of the present invention.
Figure 5:
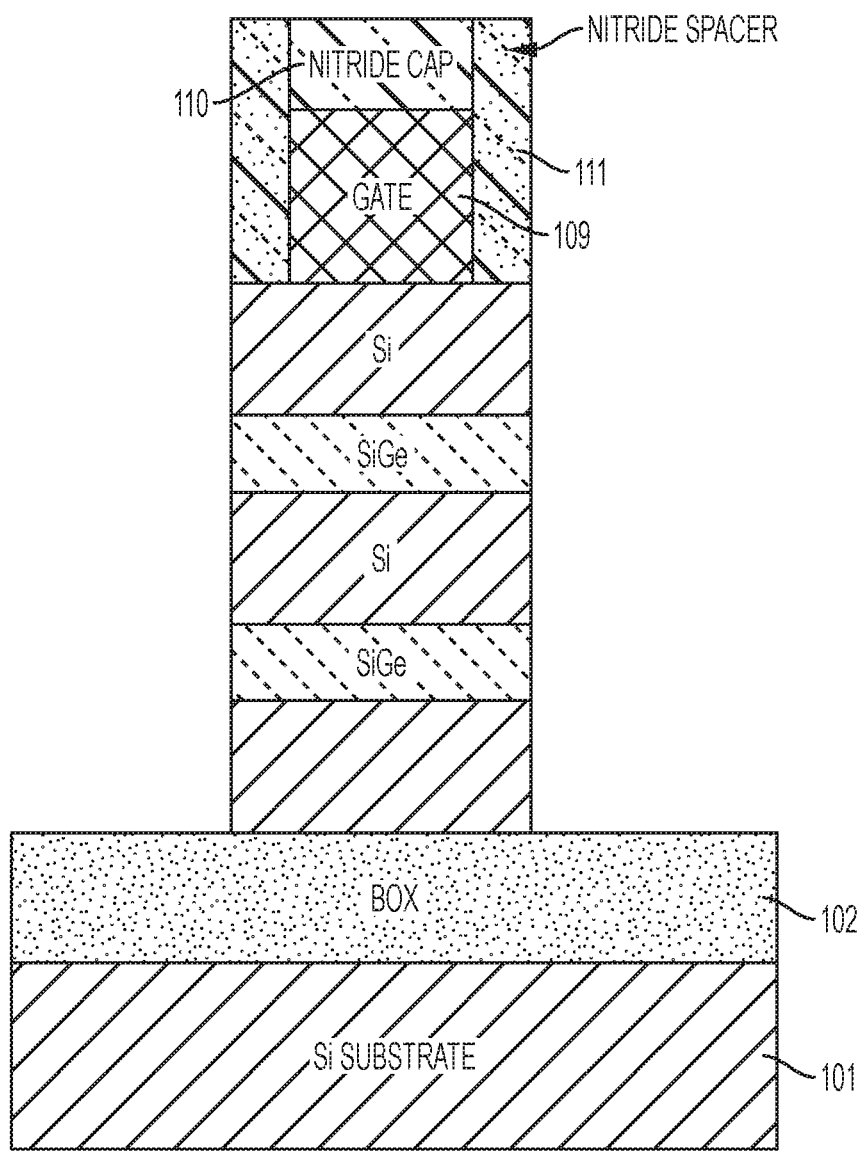
FIG. 5 is a cross-sectional view showing a gate and a cap overlying the layered fins with the ends of the alternating Si and SiGe layers removed, in accordance with the embodiments of the present invention.

The dummy gate can be selectively etched anisotropically to leave the gate 109 and the cap 110 overlying a central portion of the layered fins (FIG. 4A). A sidewall spacer 111 can be formed beside the gate 109 and the cap 110 by depositing a spacer material such as silicon nitride. FIG. 4B is a top view showing the spacer 111 disposed on the sidewalls of the gate 109 and the cap 110. An anisotropic etch can be performed to remove the ends of the layered fin to form a source cavity and a drain cavity (FIG. 5). A thickness of the gate 109 above the fin stack can vary from 20 nanometers to 100 nanometers, for example, from 40 nanometers to 60 nanometers. A thickness of the cap 110 can vary from 10 nanometers to 100 nanometers, for example, from 30 nanometers to 50 nanometers.

Figure 6:
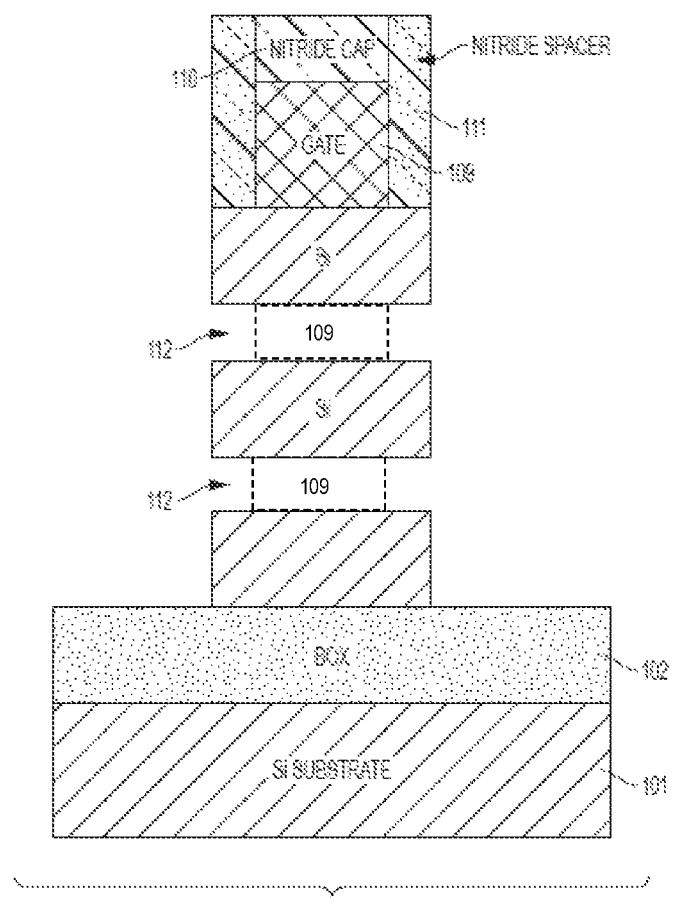
FIG. 6 is a cross-sectional view showing the fin structure with SiGe layers removed to form a gap between two adjacent Si layers, in accordance with the embodiments of the present invention.
Figure 7:
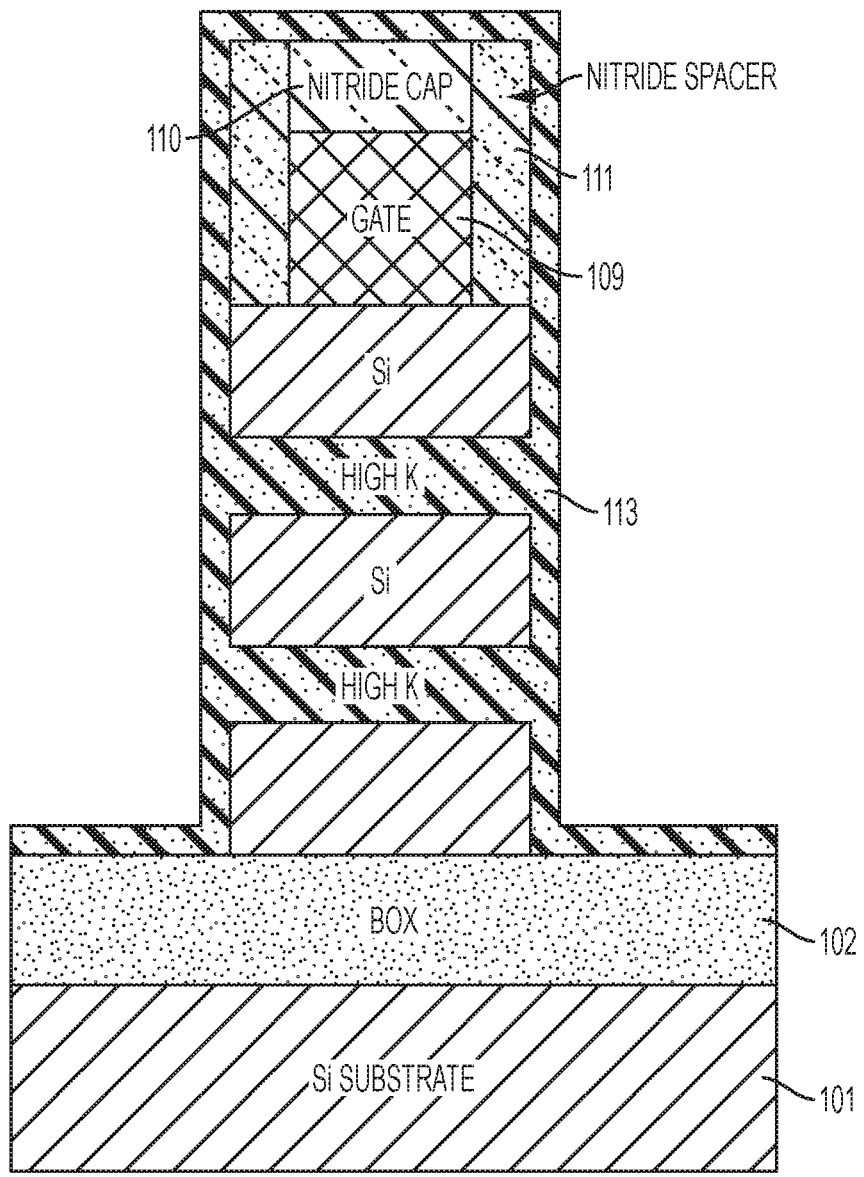
FIG. 7 is a cross-sectional view showing the fin structure with a high-K dielectric material deposited in the gaps, in accordance with the embodiments of the present invention.

The SiGe layer of the exposed portion of the layered fin can be selectively etched to produce a Si layers with gaps (voids) 112 disposed between the adjacent layers (FIG. 6). The Si layers can be anchored due to the gate wrapping around the fins. A high-K dielectric layer 113 can then be formed about the suspended Si layers to fill out the gaps thereby encasing the Si layers, the gate, the capping layer, and the spacers, as shown in FIG. 7. The high-K dielectric material composing the high-K dielectric layer 113. K stands for the relative dielectric constant. High-K dielectric materials have a K value greater than 7. Examples of high-K materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-K may further include dopants such as lanthanum, aluminum. The high-K dielectric layer can be obtained by deposition by CVD, atomic layer deposition (ALD), for example.

Figure 8:
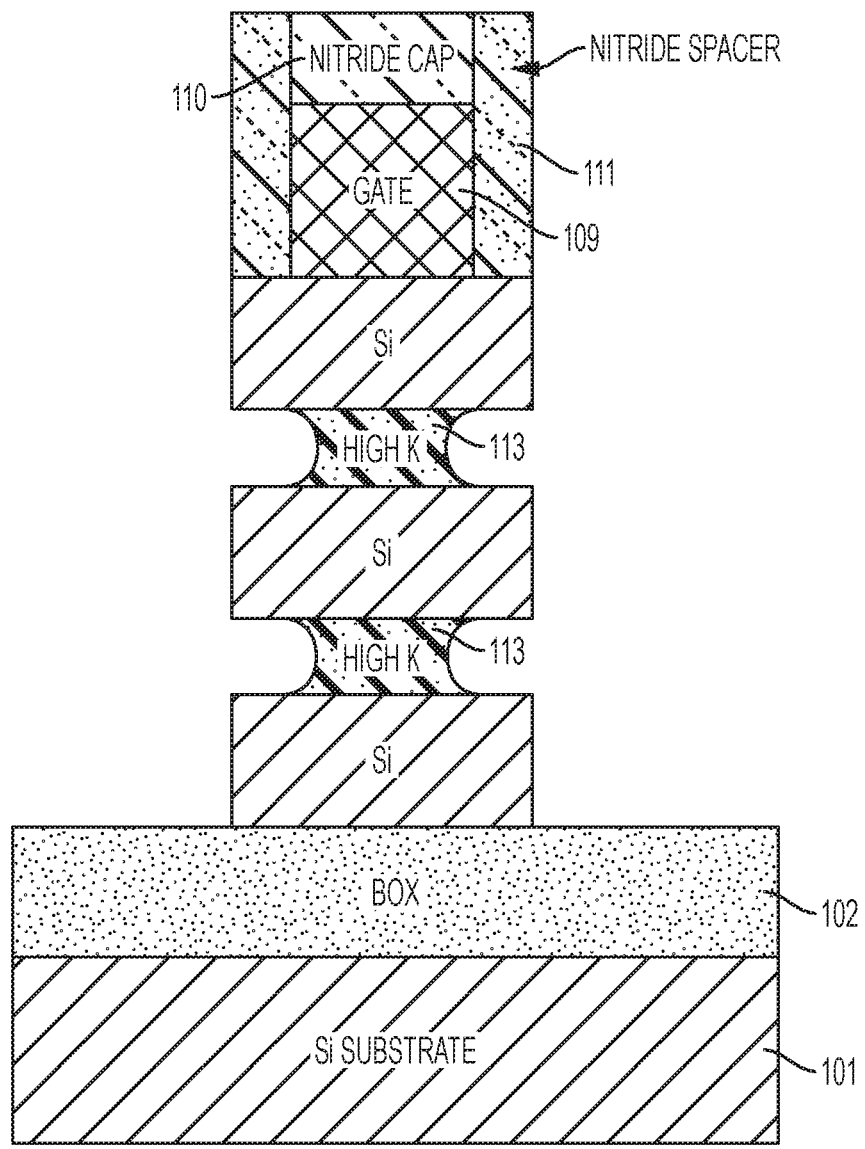
FIG. 8 is a cross-sectional view showing a high-K dielectric layer located in a central area of the gap in contact with both of the adjacent Si layers, in accordance with the embodiments of the present invention.

The high-K dielectric layer 113 can be isotropically etched to leave a portion of the high-K dielectric layer 113 in a central area of the gap in contact with both of the adjacent Si layers, as shown in FIG. 8. In an embodiment, when the gap between the two adjacent Si layers is about 5 nanometers wide, a thickness of the high-K dielectric material in the central area of the gap can be about 3 nanometers. In another embodiment, when the gap between the two adjacent Si layers is about 5 nanometers wide, a thickness of the high-K dielectric material in the central area of the gap can be about 3 nanometers.

Figure 9:
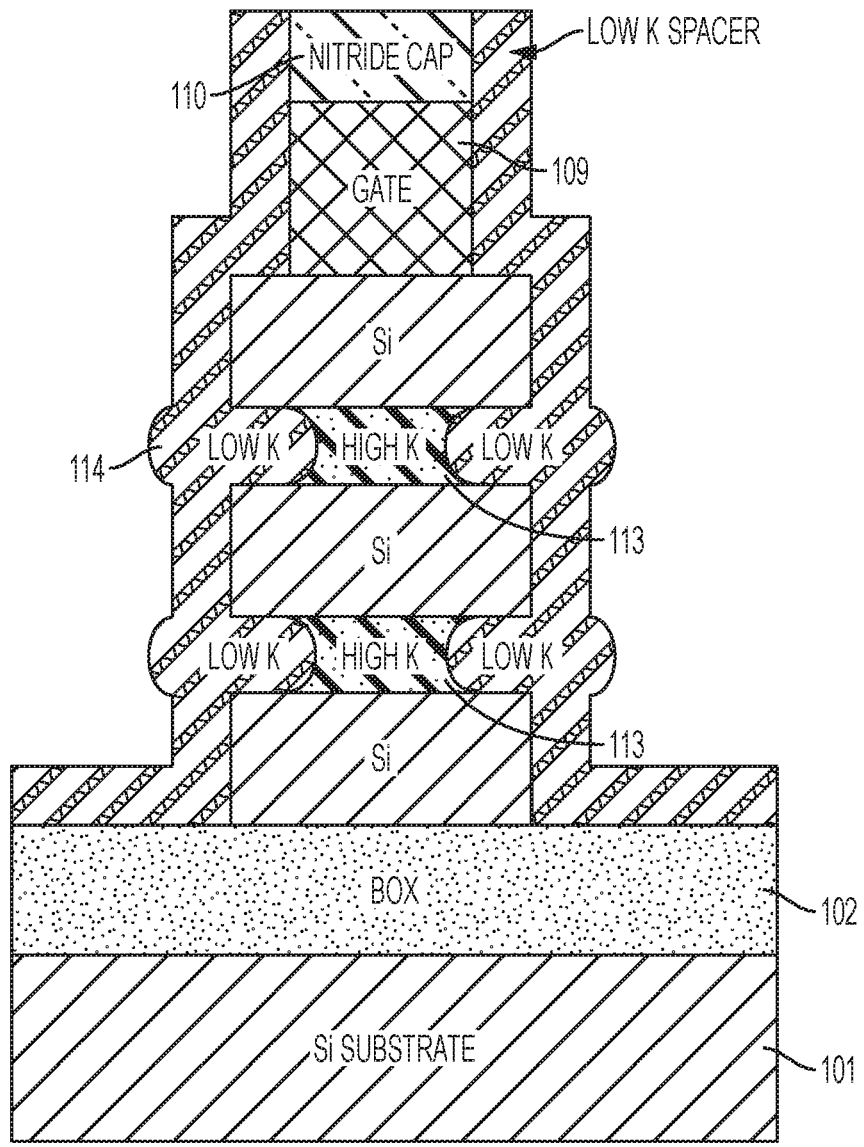
FIG. 9 is a cross-sectional view showing the layered fin structure with a high-K dielectric material deposited over the fin structure, in accordance with the embodiments of the present invention.
Figure 10:
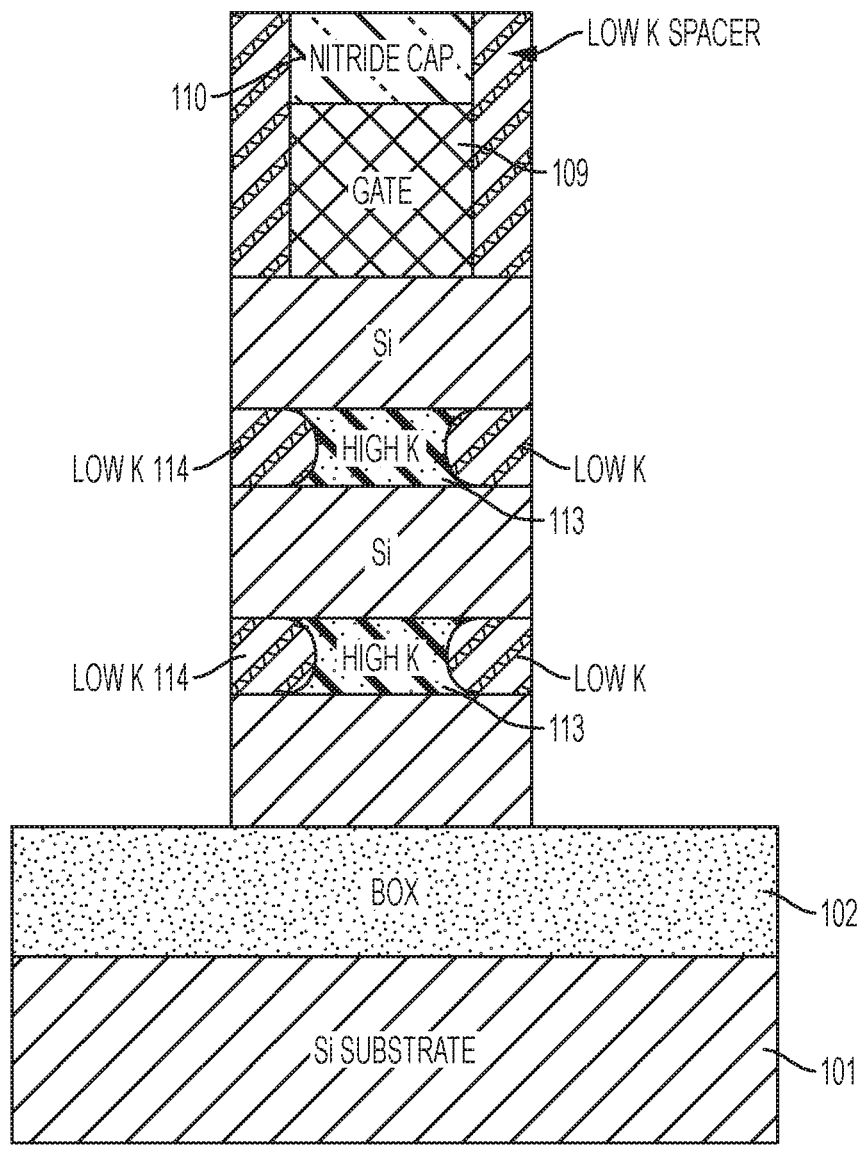
FIG. 10 is a cross-sectional view showing the layered fin structure in which the high-K material is sandwiched by the low-K material, in accordance with the embodiments of the present invention.
Figure 11:
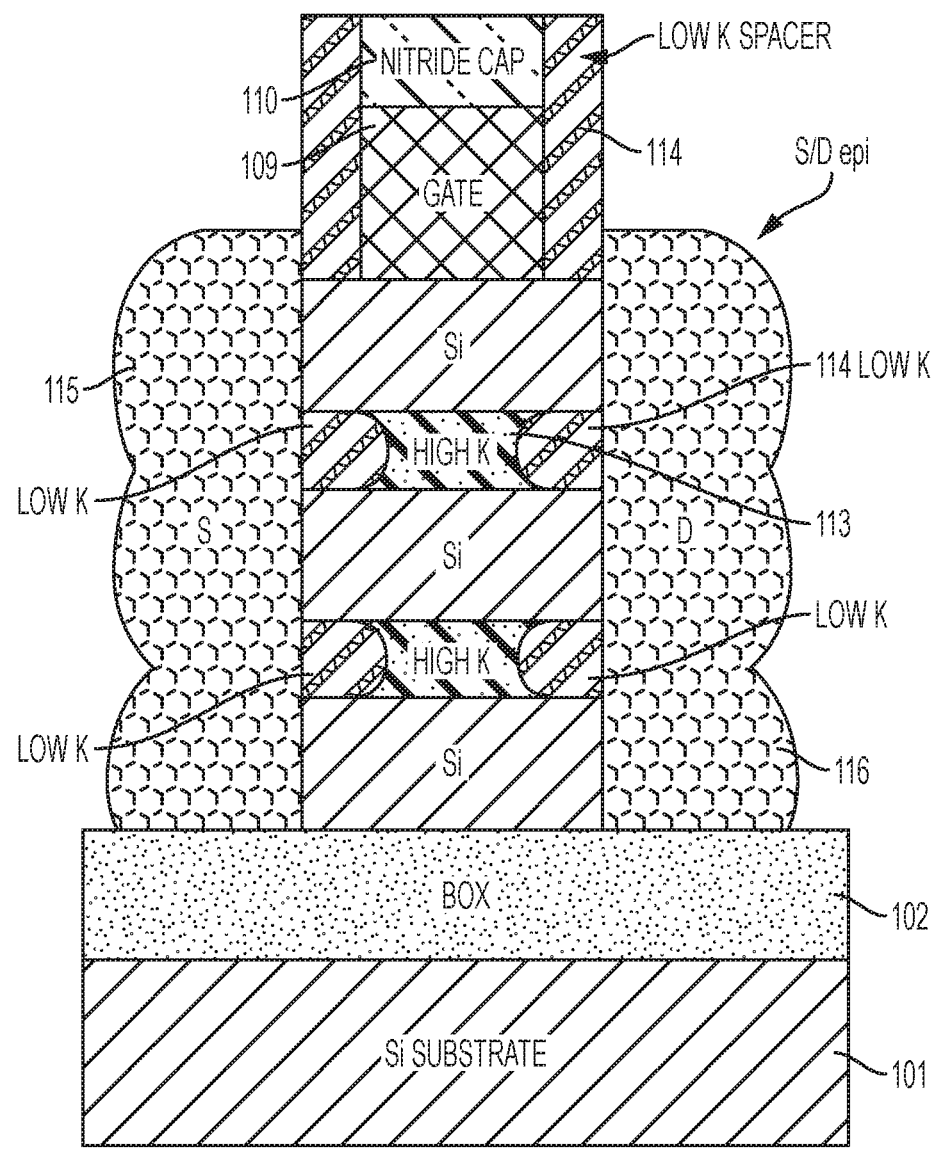
FIG. 11 is a cross-sectional view showing the layered fin structure with the source and drain regions located on the layered fin, in accordance with the embodiments of the present invention.

The spacers can be removed to expose the sidewalls of the gate 109 and the cap 110, as shown in FIG. 9. A low-K dielectric layer 114 encasing the Si layers, the portion of the high-K dielectric layer in a central area of the gap, the gate 109, and the capping layer 110 can then be formed, thereby exposing the top surface of the capping layer 110. Low-K dielectric materials have a K value less than 7. The low-K dielectric material composing the low-K dielectric layer 114 can include silicon oxide, silicon nitride, boron nitride, silicon oxynitride, SiBCN, SiOCN, SiCN, SiCO, or a combination thereof. A portion of the low-K dielectric layer can then be removed to expose the Si layers, as shown in FIG. 10. A source and drain are formed in the source and drain cavities, respectively (FIG. 11). The source/drain can be formed, for example, by epitaxy growth. Dopants can be incorporated into the source/drain regions by, in-situ doping during epitaxy, ex-situ doping, or a combination of both. The source/drain may include the material that is the same as or different from the semiconductor layer under the gate. In some embodiment, in-situ boron doped SiGe is used to form source/drain of PFET and in-situ phosphorus doped Si is used for source/drain of NFET. The doping concentration in the source/drain region may range from $1E20/cm^3$ to $2E21/cm^3$, although higher or lower doping concentration can also be employed. In some embodiments, carbon may be incorporated in the source/drain region. The high-K dielectric material can be sandwiched by the low-K material, so drain-to-source coupling is dominated by the low-K dielectric material.

As a result, a semiconductor structure can be formed. The semiconductor structure includes a layered fin overlying the semiconductor substrate, wherein the layered fin includes a plurality of semiconductor (e.g., Si) layers and a plurality of insulator layers, wherein two adjacent semiconductor (e.g., Si) layers are separated by the insulator layer, a gate disposed over the layered fin, and source and drain regions located on the layered fin. The insulator layer includes a high-K dielectric material surrounded by a low-K dielectric material, wherein the high-K dielectric material and a low-K dielectric material are in contact with the two adjacent semiconductor (e.g., Si) layers.

Figure 12A:
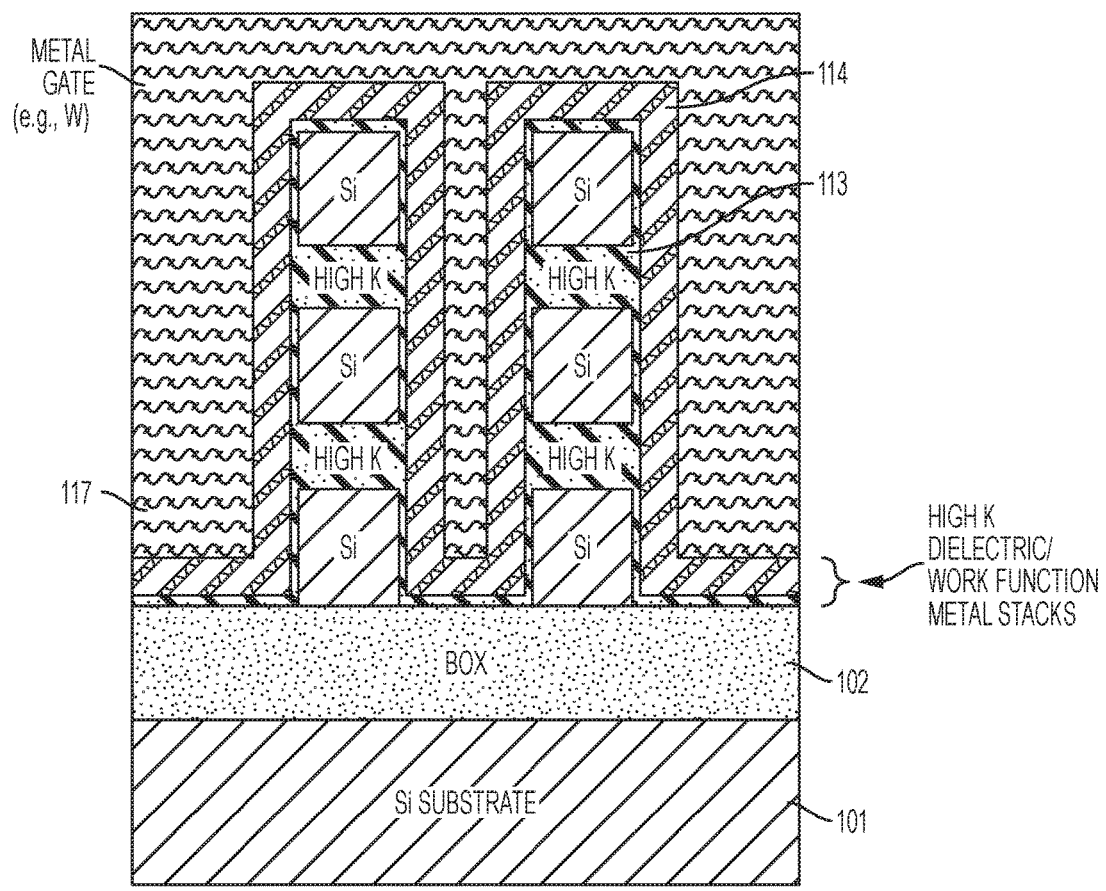
FIG. 12A is a cross-sectional view showing the fin channel of the final device structure underneath the gate, in accordance with the embodiments of the present invention.

FIGS. 12A and 12B are the cross-section and top views showing the fin channel of the final device structure underneath the gate, in accordance with the embodiments of the present invention. In these embodiments, the semiconductor structure includes a layered fin overlying the semiconductor substrate. The layered fin includes a plurality of semiconductor (e.g., Si) layers and a plurality of insulator layers. Two adjacent semiconductor (e.g., Si) layers are separated by the insulator layer, a dielectric spacer disposed over the layered fin, and a metal gate disposed over the dielectric spacer. The insulator layer includes a high-K dielectric material, which is in contact with the two adjacent semiconductor (e.g., Si) layers.

The above semiconductor structure offers several advantages over the conventional iFinFET having silicon oxide disposed between the Si fins including the following. First, the high-K between the Si fin stacks enhances gate coupling to the horizontal surfaces of each Si fin, thereby improving the drive current. Second, the low-K spacer in-between the Si fin stacks can help reduce the parasitic capacitance compared with the conventional FinFET. Third, the low-K spacer in place also helps reduce the source/drain to channel coupling, thus improving a short channel control.

Although the invention has been shown and described with respect to certain embodiments, certain equivalent alterations and modifications will occur to others skilled in the art upon the reading and understanding of this specification and the annexed drawings. In particular, regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the described structure which performs the function in the herein illustrated exemplary embodiments of the invention. In addition, a particular feature of the invention that has been described with respect to only one of several embodiments can still be combined with one or more features of the other embodiments as desired for any given or particular application.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variations in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

What is claimed is:

1. A semiconductor structure comprising:
   a layered fin overlying a semiconductor substrate, wherein the layered fin comprises semiconductor layers and insulator layers, wherein two adjacent semiconductor layers are separated by a distance filled with the insulator layers;
   a gate disposed over the layered fin;
   a spacer surrounding a sidewall of the gate; and
   source and drain regions located on the layered fin, the semiconductor layers being operatively coupled to the source and drain regions in a width direction, the width direction defined between one of the source and drain regions to another one of the source and drain regions;
   wherein the insulator layer comprises a high-K dielectric material surrounded by a low-K dielectric material;
   wherein a portion of the high-K dielectric material fills a central area of the distance in the width direction such that the portion of the high-K dielectric material is in contact with the two adjacent semiconductor layers and another portion of the low-K dielectric material fills a periphery of the distance on sides of the central area such that the another portion of the low-K dielectric material is in contact with the two adjacent semiconductor layers;
   wherein a length of the semiconductor layers in the width direction equals a combined length of the high-K dielectric material and the low-K dielectric material in the width direction.

2. The semiconductor structure according to claim 1, wherein the semiconductor layers comprise silicon.

3. The semiconductor structure according to claim 1, wherein the semiconductor substrate is a silicon-on-insulator substrate.

4. The semiconductor structure according to claim 1, wherein the semiconductor substrate is selected from the group consisting of silicon, germanium, and silicon germanium.

5. The semiconductor structure according to claim 1, wherein the semiconductor layers comprise P-type dopants.

6. The semiconductor structure according to claim 1, wherein the semiconductor layers comprise N-type dopants.

7. The semiconductor structure according to claim 1, wherein the low-K dielectric material includes a dielectric constant of about 7 or less.

8. The semiconductor structure according to claim 1, wherein the low-K dielectric material comprises silicon oxide, silicon nitride, boron nitride, silicon oxynitride, SiBCN, SiOCN, SiCN, SiCO, or a combination thereof.

9. The semiconductor structure according to claim 1, wherein the high-K dielectric material includes a dielectric constant of greater than 7.

10. The semiconductor structure according to claim 9, wherein the high-K dielectric material comprises metal oxides.

11. The semiconductor structure according to claim 1, wherein the length of each of the semiconductor layers are equal in the width direction.

12. The semiconductor structure according to claim 1, wherein the semiconductor layers comprise a first edge and a second edge in the width direction;
    wherein a combination of the high-K dielectric material and the low-K dielectric in the width direction do not extend beyond the first and second edges of the semiconductor layers.

* * * * *